(12) United States Patent
Lee

(10) Patent No.: US 6,456,543 B1
(45) Date of Patent: Sep. 24, 2002

(54) DATA INPUT/OUTPUT CIRCUIT FOR SEMICONDUCTOR MEMORY DEVICE

(75) Inventor: Jae-Goo Lee, Kwangmyung (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/376,016

(22) Filed: Aug. 18, 1999

(30) Foreign Application Priority Data

Aug. 21, 1998 (KR) .......................................... 98-33957

(51) Int. Cl.[7] ................................................. G11C 7/00
(52) U.S. Cl. ...................................................... 365/190
(58) Field of Search ................................. 365/190, 194, 365/205, 207, 208

(56) References Cited

U.S. PATENT DOCUMENTS

| | | | | |
|---|---|---|---|---|
| 4,905,317 A | | 2/1990 | Suzuki et al. ................. 371/43 |
| 5,539,691 A | * | 7/1996 | Kozaru et al. ............... 365/205 |
| 5,684,750 A | * | 11/1997 | Kondoh et al. ............. 365/205 |
| 5,724,292 A | * | 3/1998 | Wada .......................... 365/207 |
| 5,982,690 A | * | 11/1999 | Austin ......................... 365/205 |
| 6,052,328 A | * | 4/2000 | Ternullo, Jr. et al. ....... 365/190 |

* cited by examiner

Primary Examiner—Trong Phan

(57) ABSTRACT

A data input/output circuit for a semiconductor memory device includes a memory cell array, a latch-type sense amplifier for amplifying the cell data transmitted from the memory cell array in a read mode, a switching transistor for controlling a transmission of the cell data, and is connected between the memory cell array and the latch-type sense amplifier; and a write driver for storing an externally inputted cell data into the memory cell array in a write mode. The switching transistor separates the data line loading from the latch-type sense amplifier at a operation point of the latch-type sense amplifier, so that the operation speed of the sense amplifier is enhanced.

7 Claims, 5 Drawing Sheets

FIG. 3
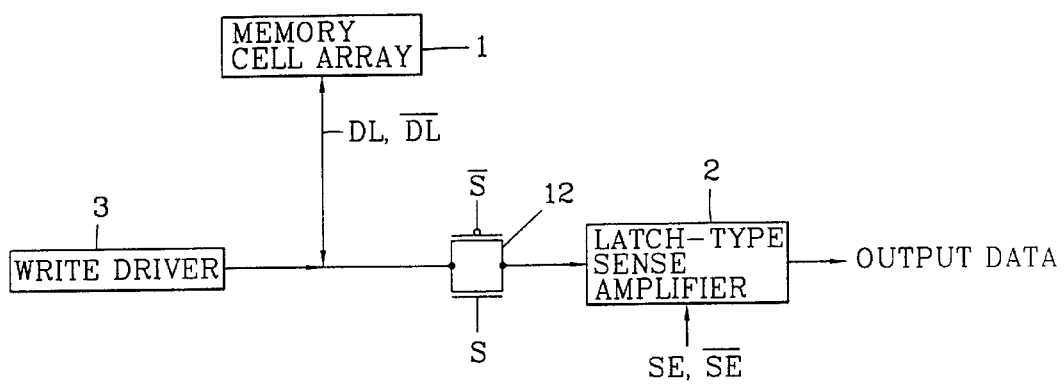
FIG. 4
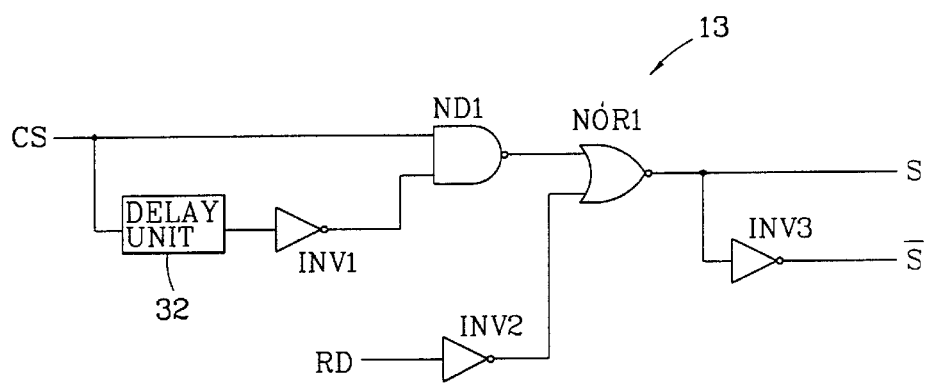
FIG. 5A    CS
FIG. 5B    S(read mode)
FIG. 5C    SE
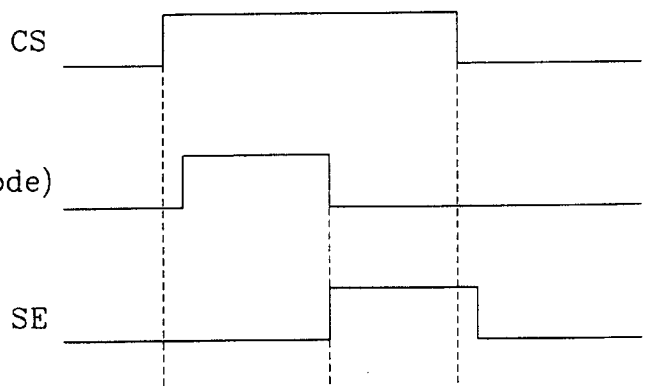

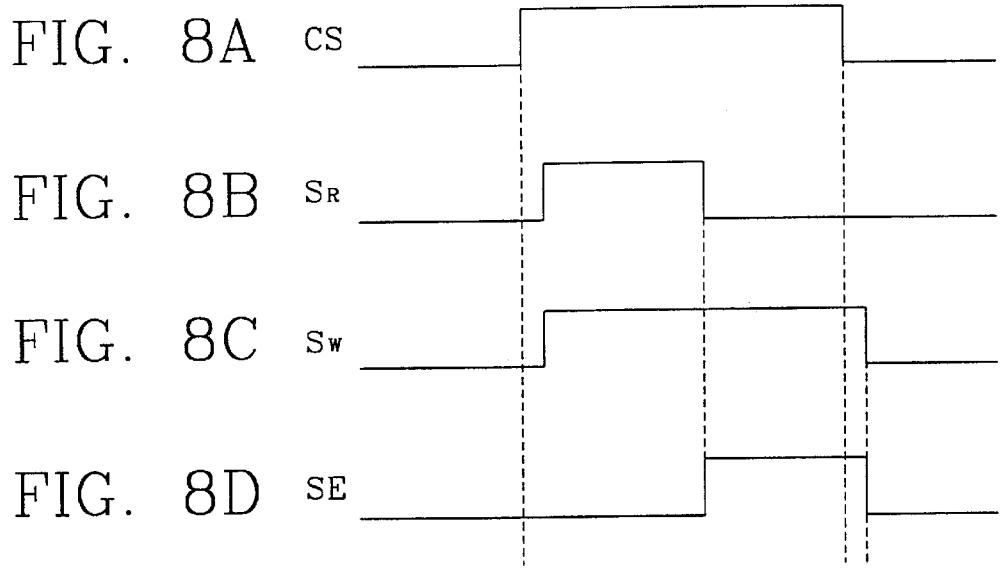
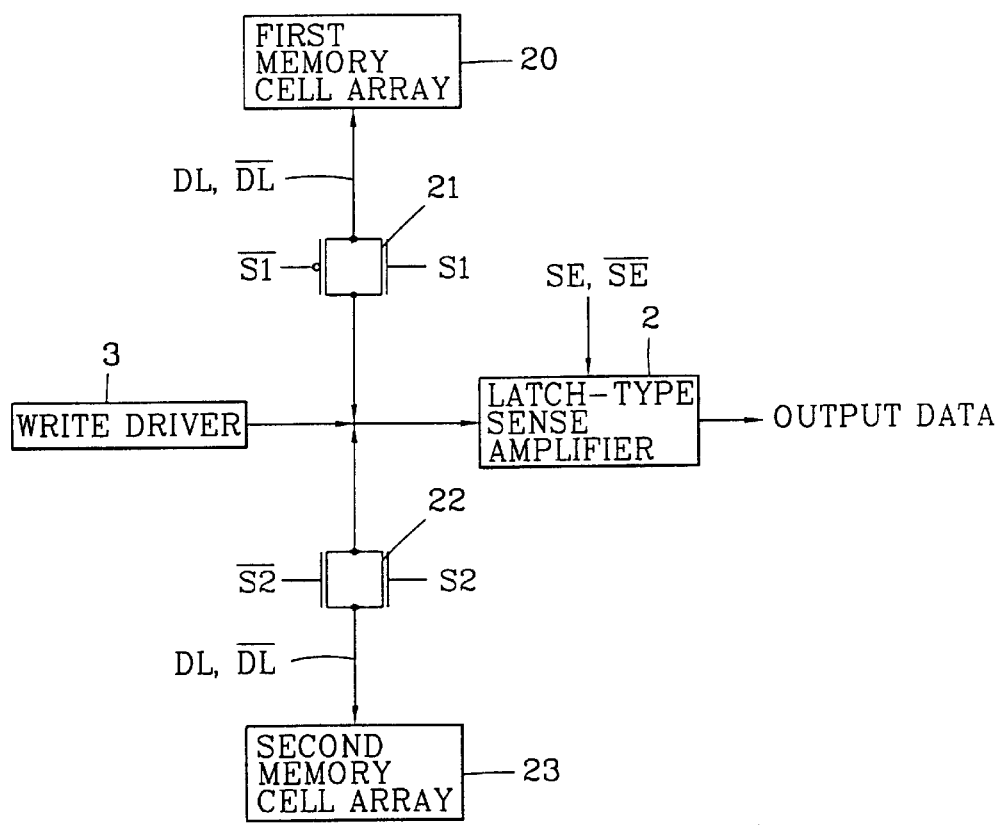

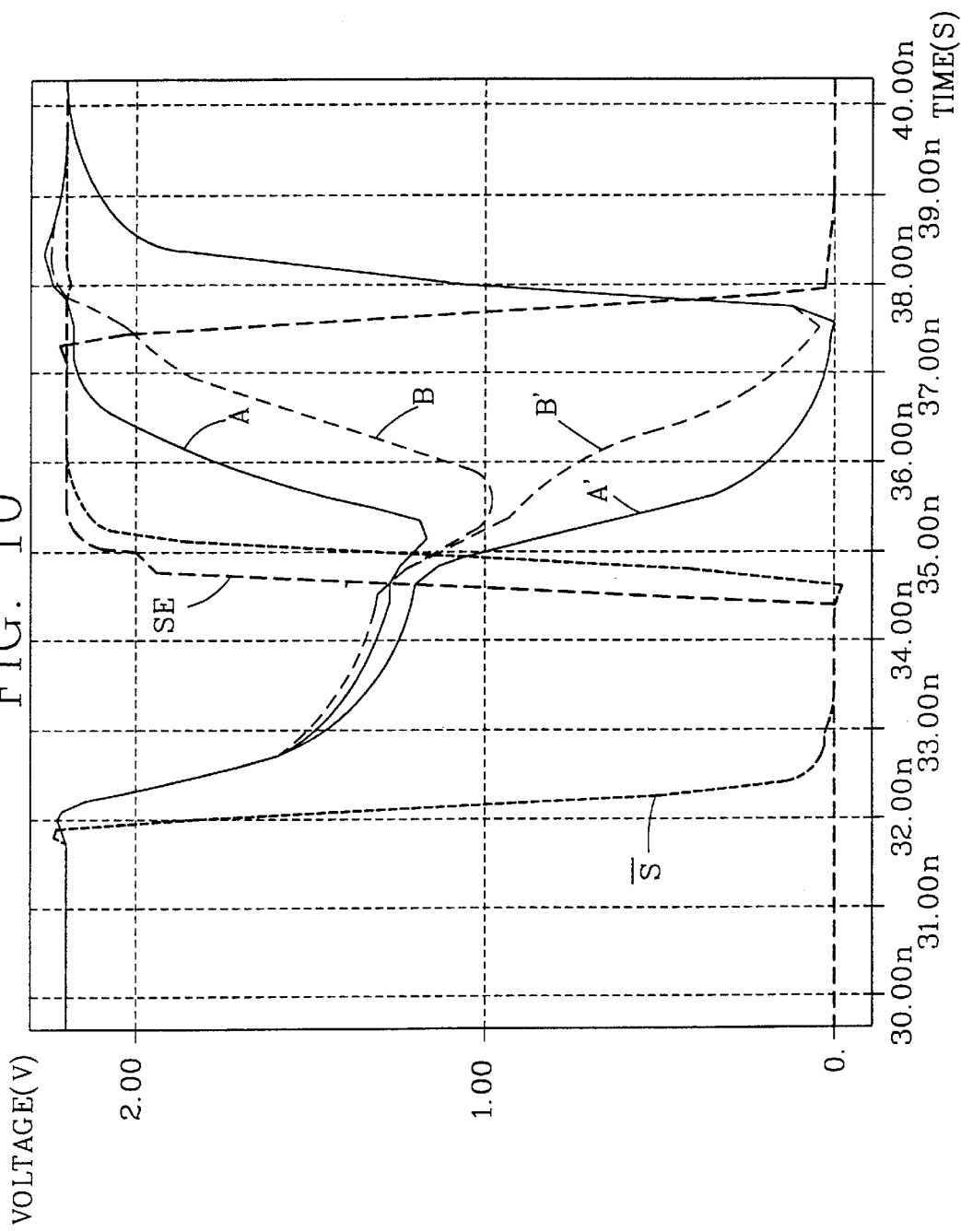

DATA INPUT/OUTPUT CIRCUIT FOR SEMICONDUCTOR MEMORY DEVICE

BACKGROUND OF THE INVENTION

1. Field of the Invention

The present invention relates to a data input/output circuit for a semiconductor memory device, and in particular to an improved data input/output circuit which is capable of enhancing an operation performance of a latch-type sense amplifier by minimizing a load of a data line.

2. Description of the Background Art

FIG. 1 is a schematic block diagram illustrating a conventional data input/output circuit for a semiconductor memory device.

As shown in FIG. 1, the data input/output circuit for a conventional semiconductor memory includes a memory cell array 1 for storing cell data, a latch-type sense amplifier 2 connected with the memory cell array 1 via the data lines DL and /DL for amplifying a data outputted from a the memory and outputting the amplified data to the output buffer(not shown), and a write driver 3 for writing an external data into the memory cell array 1, and is connected with the data lines DL and /DL.

FIG. 2 is a schematic circuit diagram illustrating the latch-type sense amplifier 2 in the circuit of FIG. 1. As shown in FIG. 2, the latch-type sense amplifier 2 includes a PMOS transistor PM1 having its channel connected between a power supply voltage VDD and a node 52 and receiving a sense amplifier enable signal SE through the gate thereof, a first and second CMOS inverters 30 and 31 connected in parallel between nodes 52 and 53 and a NMOS transistor NM1 having its channel connected between a node 53 and a ground voltage VSS and receiving an inverted sense amplifier enable signal /SE through the gate thereof.

The first CMOS inverter 30 includes a PMOS transistor PM2 and a NMOS transistor NM2 having their channels connected in series between nodes 52 and 53, and having the gates commonly connected with the data line /DL via a second input/output node 51 of the second CMOS inverter 31. Also, the second CMOS inverter 31 includes a PMOS transistor PM3 and a NMOS transistor NM3 having their channels connected in series between nodes 52 and 53, and having the gates commonly connected with the data line DL via a first input/output node 50 of the first CMOS inverter 30.

The operation of the conventional data input/output circuit of the semiconductor memory device will be explained.

In the read mode, cell data is outputted from the memory cell array 1 based on address signals (a column address signal and a row address signal) and loaded onto the data lines DL and /DL. When the cell data is sufficiently transmitted to the latch-type sense amplifier 2 via the data lines DL and /DL, the sense amplifier enabled signals SE and /SE are enable, so that the latch-type sense amplifier 2 is operated. Assuming that the cell data read from the memory cell array 1 are D and /D, respectively, the cell data D of a high level and the cell data /D of a low level are inputted to the second CMOS inverter 31 via the first input/output node 50 and the first CMOS inverter 30 via the second input/output node 51, respectively. Thus, the PMOS transistor PM2 of the first CMOS inverter 30 and the NMOS transistor NM3 of the second CMOS inverter 31 based on the cell data /D and D, respectively, are turned on. Therefore, the cell data D and /D are amplified and latched at the first and second input/output node 50 and 51, thereby outputting to the output buffer(not shown).

In the write mode, a write driver 3, which maintains a high impedance state in the read mode, transmits cell data over to the data lines DL and /DL, a certain cell in the memory cell array 1 is selected based on address signals (a column address signal and a row address signal). Therefore, the cell data loaded in the data lines DL and /DL are stored into the selected cell of the memory cell array 1.

However, an input node and an output node, that is, the identical input/output nodes 50 and 51, of the latch-type sense amplifier 2 are commonly connected. Also, the first and second input/output nodes 50 and 51 of the latch-type sense amplifier 2 are connected with the data lines DL and /DL having a long path, respectively. Thus, the loading of the data lines DL and /DL at the input node, which is generated due to the data line having a long path, is identically reflected at the output node, thereby decreasing the speed at which the data is amplified. In addition, when a size of the latch-type sense amplifier is designed to be large to minimize the above problems, the area of the entire chip and the current consumption are undesirably increased.

SUMMARY OF THE INVENTION

Accordingly, the present invention provides a data input/output circuit for a semiconductor memory device which overcomes the aforementioned problems encountered in the background art.

Also the present invention provides a data input/output circuit for a semiconductor memory device which is capable of enhancing the operation performance of the sense amplifier by minimizing the load of the data line in the read mode.

A data input/output circuit for a semiconductor memory includes a memory cell array, a latch-type sense amplifier for amplifying the cell data transmitted from the memory cell array in a read mode, a switching transistor for controlling a transmission of the cell data, connected between the memory cell array and the latch-type sense amplifier, and a write driver for storing an externally inputted cell data into the memory cell array in a write mode. The transmission gate is turned on at an initial state of the read operation mode in accordance with a read enable signal, and is turned off when the latch-type sense amplifier is operated in accordance with a sense amplifier enable signal. The switching transistor separates the data line loading from the latch-type sense amplifier at the operation point of the latch-type sense amplifier, so that the operation speed of the sense amplifier is enhanced.

Additional advantages, and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a schematic block diagram illustrating a first embodiment of a data input/output circuit for a semiconductor memory according to the present invention;

FIG. 4 is a first embodiment of a control signal generator for a transmission gate in the circuit of FIG. 3;

FIGS. 5A through 5C are signal timing diagrams illustrating the operation timing of the circuit of FIG. 3;

FIGS. 8A through 8D are signal timing diagrams illustrating the operation timing of the circuit of FIG. 6;

FIG. 9 is a schematic block diagram illustrating a third embodiment of a data input/output circuit for a semiconductor memory device according to the present invention; and FIG. 10 is a graph illustrating a simulation between the conventional circuit of FIG. 1 and circuit of the present invention as shown in FIGS. 4, 6 and 9.

DETAILED DESCRIPTION OF THE PREFERRED EMBODIMENTS

The embodiments of the present invention will be explained with reference to the accompanying drawings.

Figure 1:
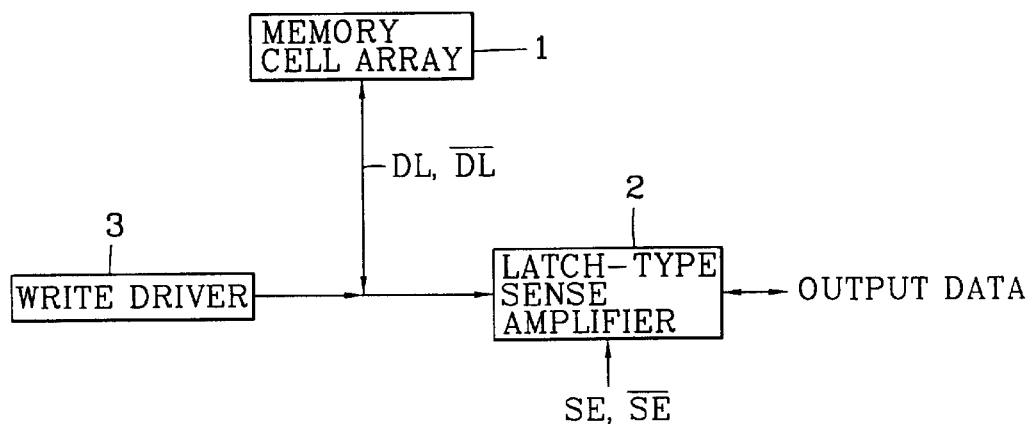
FIG. 1 is a schematic block diagram illustrating a conventional data input/output circuit for a known semiconductor memory device.
Figure 2:
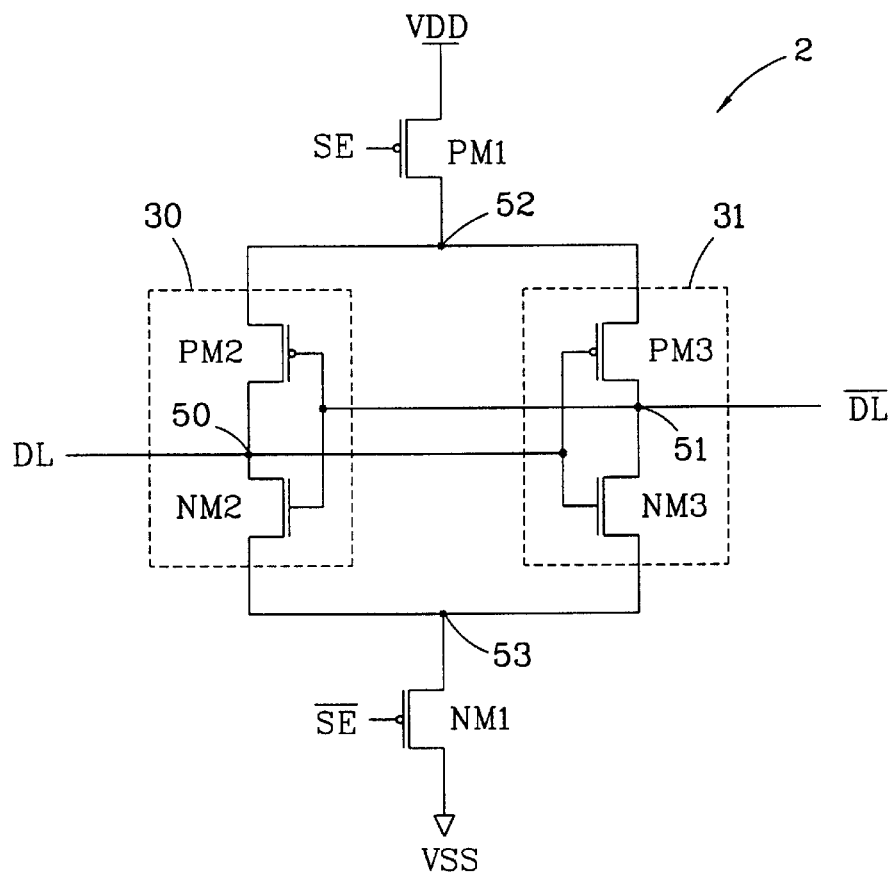
FIG. 2 is a schematic circuit diagram illustrating a sense amplifier in the circuit of FIG. 1.

FIG. 3 illustrates a first embodiment of the data input/output circuit for a semiconductor memory device according to the present invention, which further includes a transmission gate 12 connected between the data lines DL and /DL and the input nodes of the latch-type sense amplifier 2 in the circuit of FIG. 2. The transmission gate 12 is turned off when the latch-type sense amplifier 2 operates in accordance with a control signal S and an inverted control signal /S outputted from a control signal generator.

FIG. 4 illustrates a first embodiment of the control signal generator 13 for a transmission gate 12 in the circuit of FIG. 3.

As shown in FIG. 4, the control signal generator 13 includes a delay unit 32 for delaying a chip selection signal CS, an inverter INV1 for inverting an output of the delay unit 32, a NAND-gate ND1 for NANDing the chip selection signal CS and the output of the delay unit 32, an inverter INV2 for inverting a read enable signal RD, a NOR-gate NOR1 for outputting a control signal /S by NORing outputs of the NAND-gate ND1 and the inverter INV2, and an inverter INV3 for outputting a control signal /S by inverting the control signal S.

The operation of the first embodiment of the data input/output circuit for a semiconductor memory device according to the present invention will be explained with reference to the accompanying drawings.

If in a read mode whereby a read enable RD is enables to a high level after a chip selection signal CS is activated as shown in FIG. 5A, a cell data is outputted from the memory cell array 1 based on the address signals (a column address signal and a row address signal) and loaded onto the data lines DL and /DL. At this time, the write driver 3 maintains a high impedance state in the read mode. The control signal generator 13 receives the chip selection signal CS and the read enable signal RD and outputs a high level control signal S via NOR-gate NOR1 having a certain pulse width based on a delay time of the delay unit 32 as shown in FIG. 5B, and the inverter INV3 outputs a low level control signal /S by inverting the control signal S.

Therefore, the transmission gate 12 is turned on in accordance with the control signals S and /S outputted from the control signal generator 13, so that the cell data loaded on the data lines DL and /DL are transmitted to the latch-type sense amplifier 2 via the transmission gate 12. Thereafter, when the cell data is sufficiently transmitted to the latch-type sense amplifier 2, the sense amplifier enabled signals SE and /SE are enable as shown in FIG. 5D, and the control signal S transits to the low level as shown in FIG. 5B. As a result, the transmission gate 12 is turned off in accordance with the control signals S and /S when the latched-type sense amplifier 2 is operated, and thereby separating the loading of the data lines DL and /DL from the latch-type sense amplifier 13. Therefore, since the latch-type sense amplifier 2 is not affected by the loading of the data lines DL and /DL, it is possible to quickly amplify the cell data.

Figure 6:
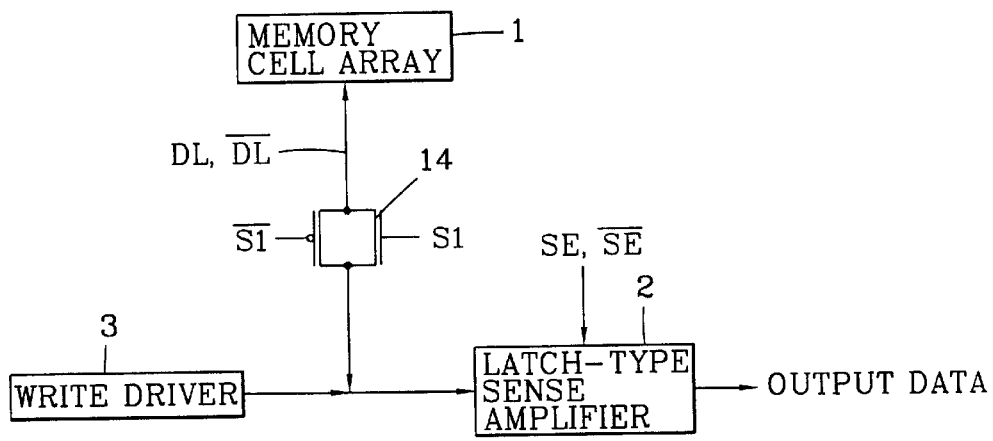
FIG. 6 is a schematic block diagram illustrating a second embodiment of a data input/output circuit for a semiconductor memory device according to the present invention.

In the write mode, the write driver 3 transmits external data to the data lines DL and /DL, and a certain cell of the memory cell array 1 is selected based on address signals (a column address signal and a row address signal). Therefore, the external data loaded on the data lines DL and /DL is stored into the selected cell of the memory cell array 1. FIG. 6 illustrates a second embodiment of the data input/output circuit for a semiconductor memory device according to the present invention.

The second embodiment of the data input/output circuit for a semiconductor memory device according to the present invention basically includes the same elements as the first embodiment of the data input/output circuit, except that the transmission gate 14 is connected to the memory cell array 1. The transmission gate 14 is turned on/off in accordance with the control signals S and /S outputted from a control signal generator in the read model (or in the write mode).

Figure 7:
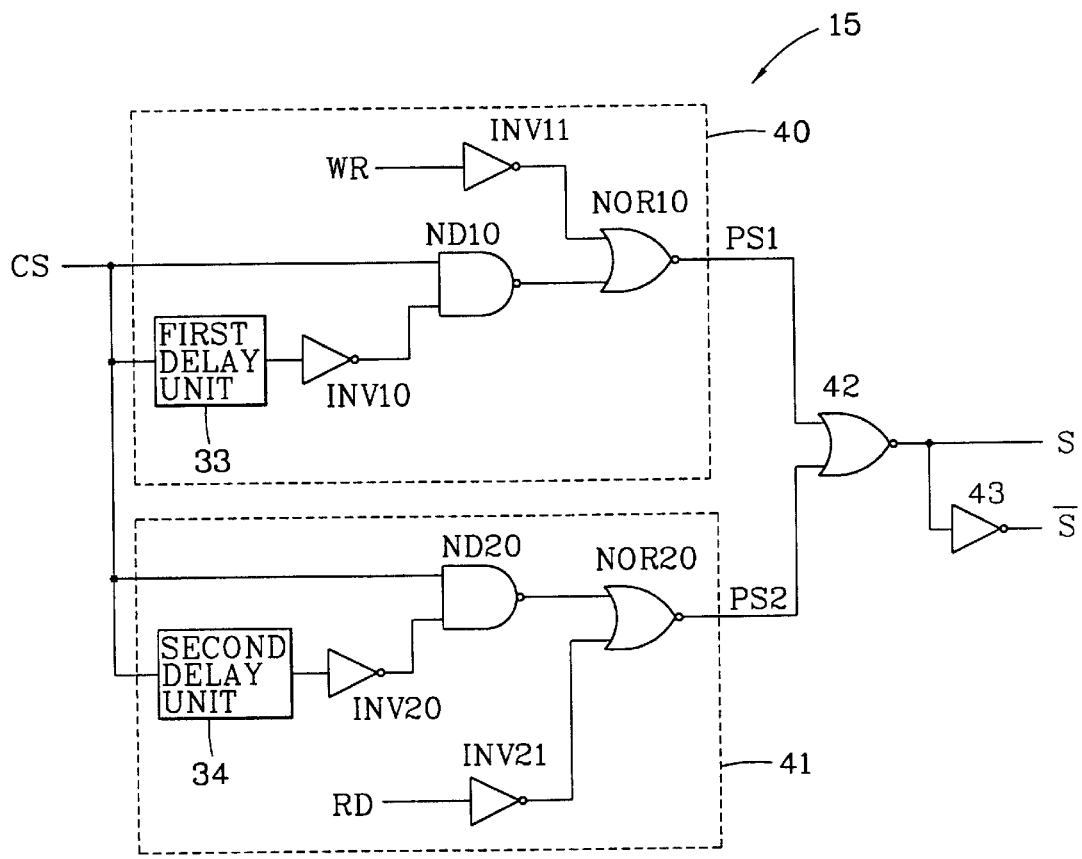
FIG. 7 is a second embodiment of a control signal generator for a transmission gate in the circuit of FIG. 6.

FIG. 7 illustrates a second embodiment of the control signal generator 15 for the transmission gate 14 in the circuit of FIG. 6.

As shown in FIG. 7, the control signal generator 15 includes a first pulse signal generator 40 for receiving the chip selection signal CS and the write signal WR and outputting a first pulse signal PS1, a second pulse signal generator 41 for receiving the chip selection signal CS and the read signal RD and outputting a second pulse signal PS2, a NOR-gate 42 for outputting the control signal S by NORing the first and second pulse signals PS1 and PS2, and an inverter 43 outputting the control signal /S by inverting the control signal S. Here, the first pulse signal generators 40 has the same structure as the second pulse signal generator 41.

The first pulse signal generator 40 includes a first delay unit 33 for delaying an chip selection signal CS, a inverter INV10 for inverting an output of the first delay unit 33, a NAND-gate ND10 for NANDing the chip selection signal CS and the output of the first delay unit 33, inverted by inverter INV10 an inverter INV11 for inverting a write enable signal WR and a NOR-gate NOR 10 for NORing the outputs of the NAND-gate ND10 and the inverter INV11 to output the first pulse signal PS1. The second pulse signal generator 41 includes a second delay unit 34 for delaying a chip selection signal CS, an inverter INV20 for inverting an output of the second delay unit 34, a NAND-gate ND20 for NANDing the chip selection signal CS and the output of the second delay unit 34 inverted by the inverter INVIO, an inverter INV21 for inverting a read enable signal RD and a NOR-gate NOR 20 for NORing the outputs of the NAND-gate ND20 and the inverter INV21 to output the second pulse signal PS1. The delay time of the first delay unit 33 is longer than that of the second delay unit 34, and thus the pulse width of the first pulse signal PS1 is larger than that of the second pulse signal PS2.

The operation of the second embodiment of the data input/output circuit for a semiconductor memory device according to the present invention will be explained with reference to the accompanying drawings.

In the read mode, as shown in FIG. 6, a cell data is outputted from the memory cell array 1 based on the address signals and loaded on the data lines DL and /DL. At this time, as shown in FIG. 7, the first pulse signal generator 40 of the control signal generator 15 outputs a fixed first pulse signal PS1 of a low level in accordance with the high level chip selection signal CS and the low level write enable signal WR, and the second pulse signal generator 41 outputs a low level second pulse signal PS2 having a certain pulse width based on a delay time of the second delay unit 34. Thus, NOR-gate 42, which operates as an inverter, outputs a control signal $S_R$ as shown in FIG. 8B by NORing the first and second pulse signal PS1 while PS2, and the inverter 43 outputs an inverted control signal /$S_R$. Here, the pulse width of each control signal $S_R$ and /$S_R$ is determined by the delay time of the second delay unit 34.

Therefore, the transmission gate 14 is turned on in accordance with the control signals $S_R$ and /$S_R$ outputted from the control signal generator 15, so that the cell data loaded on the data lines DL and /DL are transmitted to the latch-type sense amplifier 2. Thereafter, when the sense amplifier enable signal SE and /SE are enabled as shown in FIG. 8D, the control signal $S_R$ transits to the low level as shown in FIG. 8B and the control signal /$S_R$ transits to the high level. Thus, the transmission gate 14 is turned off in accordance with the control signals $S_R$ and /$S_R$ when the latch-type sense amplifier 2 is operated, thereby separating the loading of the data lines DL and /DL from the latch-type sense amplifier 2. The latch-type sense amplifier 2 amplifies the inputted cell data D and /D and outputs to the output buffer(not shown).

In the write mode, if the write enable signal WR is enabled, the first pulse signal generator 40 of the control signal generator 15 outputs a low level second pulse signal PS1 having a certain pulse width based on a delay time of the first delay unit 33. At this time, the second pulse signal generator 41 outputs a fixed first pulse signal PS2 of a low level in accordance with the high level chip selection signal CS and the low level read enable signal RD. Thus, NOR-gate 42, which operates as an inverter, outputs a control signal $S_W$ having a certain pulse width as shown in FIG. 8C, by inverting the first pulse signal PS1, and the inverter 43 outputs an inverted control signal /$S_W$. Here, the pulse width of the control signals $S_W$ and /$S_W$ are each determined by the delay time of the first delay unit 33.

Therefore, the write driver 3, which maintains a high impedance state in the read mode, transmits external data to the data lines DL and /DL via the transmission gate 14 turned on in accordance with the control signals $S_W$ and signal /$S_W$. At this time, the turned-on state of the transmission gate 14 is maintained by the control signals $S_W$ and /$S_W$ having a long pulse width until the external data is fully transmitted to the data lines DL and /DL and then stored into the selected cell of the memory cell array 1.

FIG. 9 illustrates a third embodiment of the data input/output circuit for a semiconductor memory device according to the present invention, which includes two transmission gates (first and second transmission gates 21 and 22) for selecting a first memory cell array 23 20 or a second memory cell array. The operation of the third embodiment of the data input/output circuit is performed identically to the operation of the second embodiment of the data input/output circuit, except that one of the memory cell arrays 20 and 23 is selectively selected.

FIG. 10 illustrates a simulation graph comparing the operation of the data input/output circuits of the present invention and that of the conventional art, respectively. Here, each graph labled A and A' indicates a data D and an inverted data /D according to the present invention, and each graph labled B and B' indicates a data D and an inverted data /D according to the conventional art. We can see from the simulation graph that a data amplifying speed according to the present invention is graeter then that of the conventional art.

As described above, in the read mode, the data input/output circuit for a semiconductor memory according to the present invention separates the data line loading from the latch-type sense amplifier at the operation point of the latch-type sense amplifier. Thus, the operation speed of the sense amplifier is enhanced, and a overlap current caused by the operation of a low speed latch-type sense amplifier is reduced.

Also, in the write mode, the data input/output circuit for a semiconductor memory according to the present invention outputs a control signals having a pulse width that is greater than a pulse width in the read mode to the transmission gate, so that the externally applied data are accurately written into the selected cell of the memory cell array.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A data input/output circuit for a semiconductor memory device, comprising:
   a first memory cell array;
   a first switching transistor connected with a output node of the first memory cell array, and is controlled by a first switching control signal;
   a second memory cell array;
   a second switching transistor connected with a output node of the second memory cell array, and is controlled by a second switching control signal
   a latch-type sense amplifier for amplifying the cell data transmitted via the first switching transistor or the second switching transistor from the memory cell array in a read mode; and
   a write driver for storing an externally inputted cell data into the memory cell array via the first switching transistor or the second switching transistor in a write mode.

2. The circuit of claim 1, wherein the first and second switching transistors are a transmission gate.

3. The circuit of claim 1, wherein the first and second switching transistors are respectively controlled by a first control signal outputted from a control signal generator in a read mode, and is respectively controlled by a second control signal outputted from a control signal generator in a write mode.

4. The circuit of claim 3, wherein a pulse width of the first control signal is longer than that of the second control signal.

5. The circuit of claim 3, wherein the control signal generator includes:
   a first pulse signal generator for receiving the chip selection signal and a write enable signal and outputting a first pulse signal;
   a second pulse signal generator for receiving the chip selection signal and a read enable signal and outputting a second pulse signal; and a NOR-gates for outputting the first or second control signal by NORing the first and second pulse signals.

6. The circuit of claim 5, wherein each of the first and second control signal generators includes:

a delay unit for delaying a chip selection signal;

a inverter for inverting an output of the first delay unit;

a NAND-gate for NANDing the chip selection signal and the output of the first inverter;

a inverter for inverting a first or a second signal; and a first NOR-gate for NORing an outputs of the NAND-gate and the inverter and outputting the first pulse signal.

7. The circuit of claim 6, wherein a delay time of the delay unit in the first control signal generator is longer than that of the delay unit in the second control signal generator, and the first signal is a write enable signal and the second signal is a read enable signal.

* * * * *